United States Patent
Swanson

(10) Patent No.: US 7,259,617 B2
(45) Date of Patent: Aug. 21, 2007

(54) APPARATUS AND METHOD FOR EFFECTING SIGNAL CHOPPING IN AN AMPLIFIER DEVICE

(75) Inventor: Leland Scott Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 196 days.

(21) Appl. No.: 11/196,166

(22) Filed: Aug. 3, 2005

(65) Prior Publication Data

US 2007/0030060 A1    Feb. 8, 2007

(51) Int. Cl.
   *H03F 3/38*    (2006.01)
(52) U.S. Cl. .................. 330/10; 330/251; 330/207 A
(58) Field of Classification Search .............. 330/10, 330/251, 207 A
   See application file for complete search history.

(56) References Cited

U.S. PATENT DOCUMENTS

| | | | | |
|---|---|---|---|---|
| 6,031,421 A | * | 2/2000 | McEwan | ............. 330/10 |
| 6,259,313 B1 | * | 7/2001 | Lewicki | ............. 327/563 |
| 6,621,334 B2 | * | 9/2003 | Ausserlechner et al. | ....... 330/9 |
| 6,674,322 B2 | * | 1/2004 | Motz | ............. 330/9 |
| 6,734,723 B2 | * | 5/2004 | Huijsing et al. | ........... 330/9 |
| 7,142,050 B2 | * | 11/2006 | Risbo | ............. 330/10 |

\* cited by examiner

*Primary Examiner*—Patricia Nguyen
(74) *Attorney, Agent, or Firm*—Wade J. Brady, III; Frederick J. Telecky, Jr.

(57) ABSTRACT

An apparatus for effecting signal chopping in an amplifier device having an amplifier section, a modulation section, a ramp generating section and a clock section includes: at least one signal treating unit coupled among the clock section, the amplifier section and the ramp generating section. The at least one signal treating unit cooperates with the clock section to effect providing a chopping signal to the amplifying unit at a chopping frequency and to effect providing a ramping signal at a ramping frequency to the ramp generating section. The chopping frequency is neither a fundamental frequency nor a harmonic frequency of the ramping frequency.

12 Claims, 4 Drawing Sheets

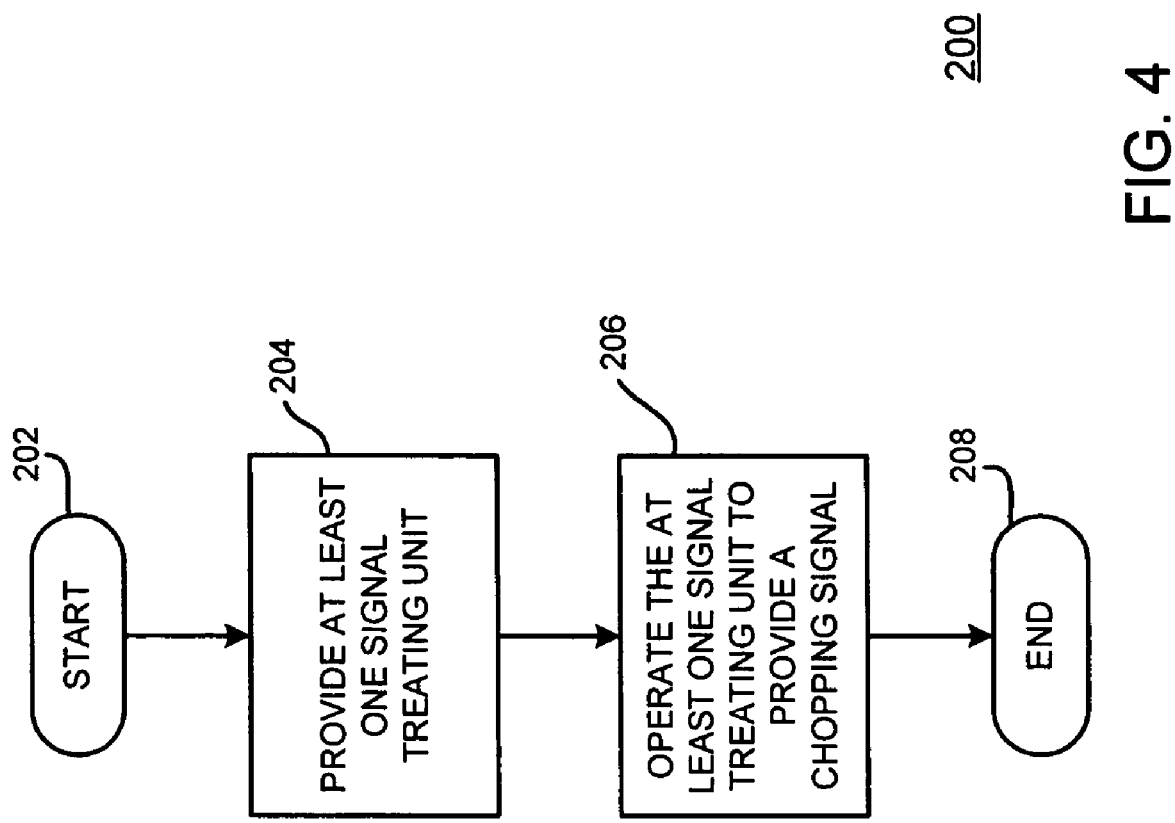

APPARATUS AND METHOD FOR EFFECTING SIGNAL CHOPPING IN AN AMPLIFIER DEVICE

BACKGROUND OF THE INVENTION

The present invention is directed to electrical amplifiers. The present invention has especial relevance to Class D amplifiers. Electrical amplifiers inherently generate noise during their operation. Class D amplifiers generally have higher noise than Class A-B amplifiers because of the added complexity of circuitry embodying a Class D amplifier contributing additional noise sources along signal paths.

To reduce noise in an amplifier such as a Class D amplifier, preamplifier noise may be shifted up in frequency by chopping the analog audio signal being amplified. To create a pulse width modulated (PWM) output signal, the audio signal is compared with a saw tooth ramp. If frequency of the chopping signal and the ramp signals are substantially the same frequency or if one of the chopping signal and the ramp signal is substantially a multiple or a harmonic of the other signal, the preamplifier noise can be mixed back down to the audio frequency band, the band of the audio signal being amplified. As a result of such mixing down to the audio band, reduction of noise by employment of a chopping signal is not accomplished to the amount that could otherwise be achieved.

There is a need for an apparatus and method for effecting chopping in an amplifier device that avoids mixing down noise to the frequency band being amplified by the amplifier device.

SUMMARY OF THE INVENTION

An apparatus for effecting signal chopping in an amplifier device having an amplifier section, a modulation section, a ramp generating section and a clock section includes: at least one signal treating unit coupled among the clock section, the amplifier section and the ramp generating section. The at least one signal treating unit cooperates with the clock section to effect providing a chopping signal to the amplifying unit at a chopping frequency and to effect providing a ramping signal at a ramping frequency to the ramp generating section. The chopping frequency is neither a fundamental frequency nor a harmonic frequency of the ramping frequency.

It is, therefore, an object of the present invention to provide an apparatus and method for effecting chopping in an amplifier device that avoids mixing down noise to the frequency band being amplified by the amplifier device.

Further objects and features of the present invention will be apparent from the following specification and claims when considered in connection with the accompanying drawings, in which like elements are labeled using like reference numerals in the various figures, illustrating the preferred embodiments of the invention.

BRIEF DESCRIPTION OF THE DRAWINGS

FIG. 4 is a flow chart illustrating the method of the present invention.

DETAILED DESCRIPTION OF THE PREFERRED EMBODIMENT

Figure 1:
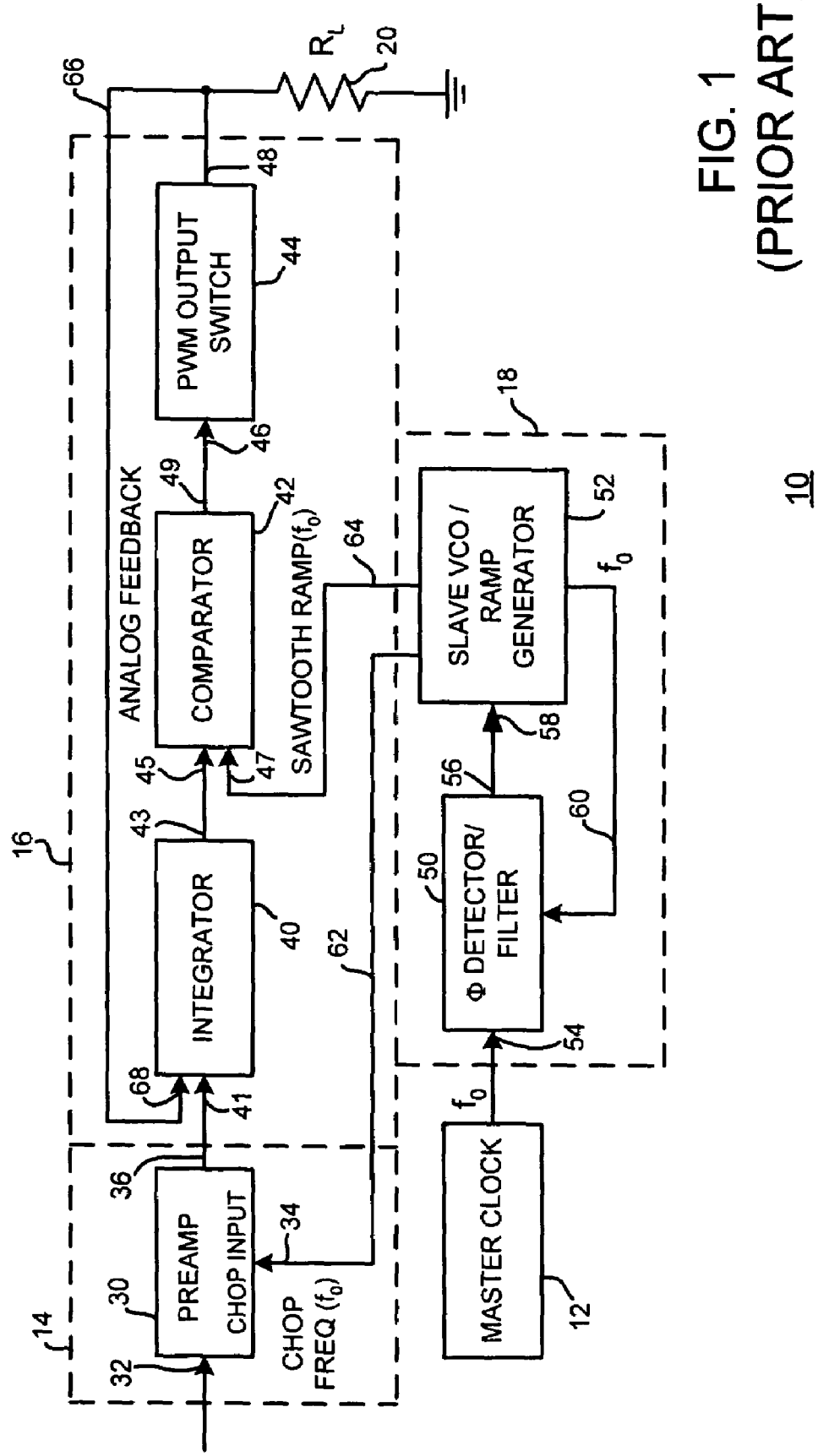
FIG. 1 is a schematic diagram illustrating a prior art amplifying apparatus using a chopping signal.

FIG. 1 is a schematic diagram illustrating a prior art amplifying apparatus using a chopping signal. In FIG. 1, an amplifier device 10 is embodied, by way of example and not by way of limitation, in a Class D amplifier having a master clock unit 12, an amplifier section 14, a modulation section 16 and a ramp generating section 18. Modulation section 16 is coupled with a load 20 represented by a load resistor $R_L$.

Amplifier section 14 includes a preamplifier unit 30. Preamplifier unit 30 receives an input signal at an amplifier input locus 32. A chopping signal is received at a chop input locus 34. The chopping signal has a frequency $f_0$ which is preferably significantly higher than the frequency of input signals received at amplifier input locus 32. Preamplifier 30 presents an amplified signal to modulation section 16 at an amplifier output locus 36.

Modulation section 16 includes an integrator unit 40, a comparator unit 42 and a pulse width modulation (PWM) switch unit 44. Amplified signals presented at amplifier output locus 36 are received by modulation section 16 at an integrator input locus 41 of integrator unit 40. Integrator unit 40 presents an integrated signal at an integrator output locus 43. Integrator output locus 43 is coupled to present integrated signals from integrator unit 40 to a first comparator input locus 45. Comparator unit 42 receives a sawtooth ramp signal at a second comparator input locus 47. Comparator unit 42 presents a comparison result signal at a comparator output locus 49. PWM output switch unit 44 receives comparison result signals presented at comparator output locus 49 at a PWM switch unit input locus 46. PWM output switch unit 44 presents a PWM output switch signal at a PWM switch unit output locus 48. PWM switch unit output locus 48 is coupled with load 20 and with a PWM feedback line 66. PWM feedback line 66 provides signals appearing at PWM switch unit output locus 48 to a feedback input locus 68 of integrator unit 40.

Master clock unit 12 provides a ramping signal at a ramping frequency $f_0$ to ramp generating section 18. Ramp generating section 18 includes a phase (Φ) detector/filter unit 50 and a slave VCO (voltage controlled oscillator)/ramp generator unit 52. Φ detector/filter unit 50 receives the ramping signal from master clock unit 12 at a Φ detector input locus 54. Φ detector/filter unit 50 presents a phase indicator signal at a Φ detector output locus 56. Slave VCO/ramp generator unit 52 receives the phase indicator signal from Φ detector/filter unit 50 at a slave VCO input locus 58.

Slave VCO/ramp generator unit 52 provides a feedback signal via a feedback line 60 to Φ detector/filter unit 50. The feedback signal has a frequency substantially the same as the ramping signal ($f_0$). Slave VCO/ramp generator unit 52 also provides a chopping signal via a line 62 to chop input locus 34 of preamplifier 30. The chopping signal has a frequency substantially the same as the ramping signal ($f_0$). Slave VCO/ramp generator unit 52 further provides a sawtooth ramp signal via a line 64 to second comparator unit input locus 47. The sawtooth ramp signal has a frequency substantially the same as the ramping signal and the chopping signal ($f_0$).

As mentioned earlier herein, there is a problem when amplifier device 10 uses a chopping frequency and a sawtooth ramp signal having substantially the same frequency ($f_0$). In that arrangement, signal noise can be mixed from frequency $f_0$ down to the frequency band of comparator unit 42. When amplifier device 10 is embodied in an audio amplifier, audio noise can be mixed from frequency $f_0$ down to the audio band in comparator unit 42.

Figure 2:
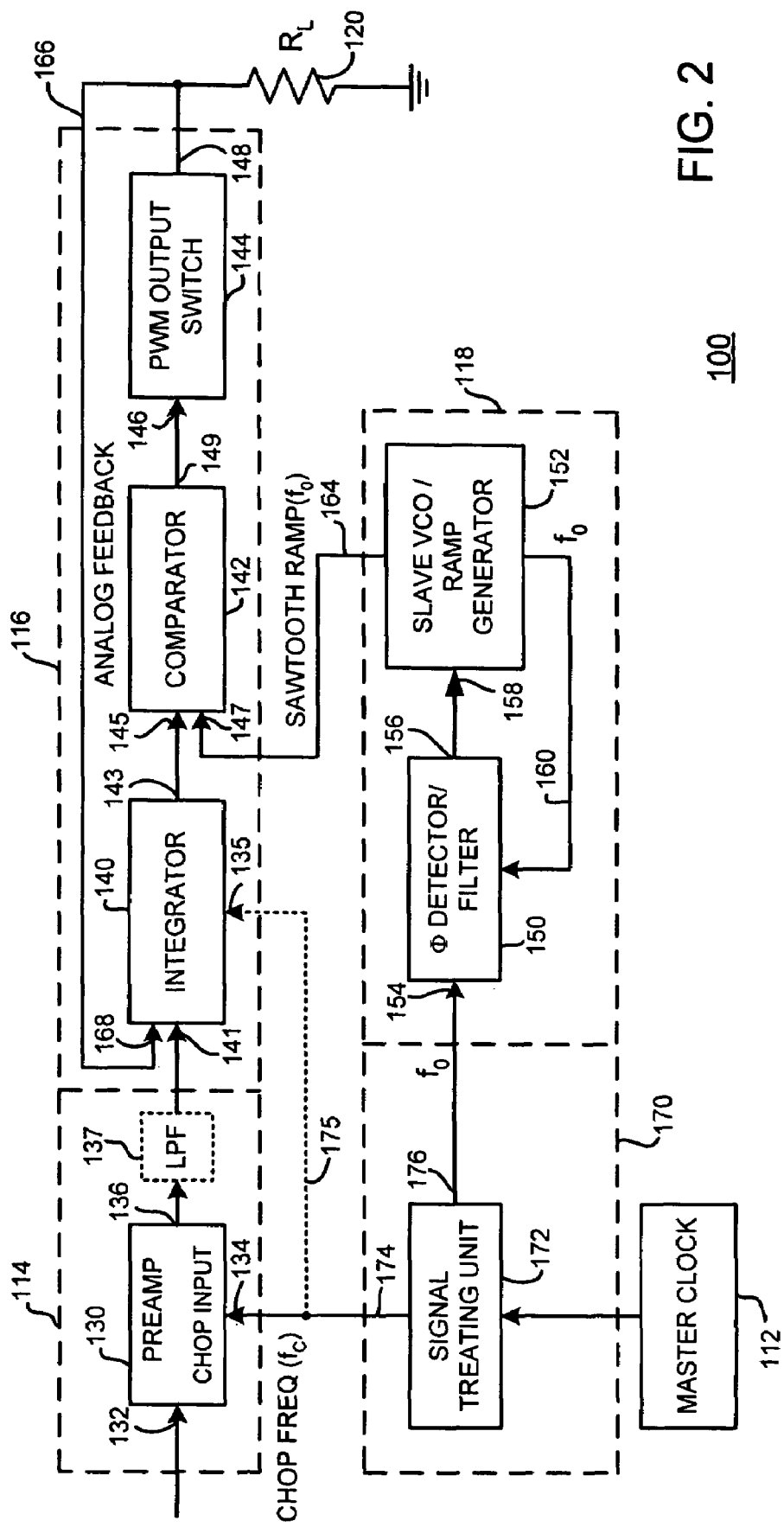
FIG. 2 is a schematic diagram of an amplifying apparatus employing the present invention to provide a chopping signal.

FIG. 2 is a schematic diagram of an amplifying apparatus employing the present invention to provide a chopping signal. In FIG. 2, an amplifier device 100 is embodied, by way of example and not by way of limitation, in a Class D amplifier having a master clock unit 112, an amplifier section 114, a modulation section 116, a ramp generating section 118 and a signal treating section 170. Modulation section 116 is coupled with a load 120 represented by a load resistor $R_L$.

Amplifier section 114 includes a preamplifier unit 130. Amplifier section 114 may also include a low pass filter (LPF) 137, if desired. The optional nature of LPF 137 is indicated by its being depicted using a dotted line format. Preamplifier unit 130 receives an input signal at an amplifier input locus 132. A chopping signal is received at a chop input locus 134. Preamplifier unit 130 presents an amplified signal to modulation section 116 at an amplifier output locus 136.

Modulation section 116 includes an integrator unit 140, a comparator unit 142 and a pulse width modulation (PWM) switch unit 144. Amplified signals presented at amplifier output locus 136 are received by modulation section 116 (via LPF 137, if present) at an integrator input locus 141 of integrator unit 140. Integrator unit 140 presents an integrated signal at an integrator output locus 143. Integrator output locus 143 is coupled to present integrated signals from integrator unit 140 to a first comparator input locus 145. Comparator unit 142 receives a sawtooth ramp signal at a second comparator input locus 147. Comparator unit 142 presents a comparison result signal at a comparator output locus 149. PWM output switch unit 144 receives comparison result signals presented at comparator output locus 149 at a PWM switch unit input locus 146. PWM output switch unit 144 presents a PWM output switch signal at a PWM switch unit output locus 148. PWM switch unit output locus 148 is coupled with load 120 and with a PWM feedback line 166. PWM feedback line 166 provides signals appearing at PWM switch unit output locus 148 to a feedback input locus 168 of integrator unit 140.

Master clock unit 112 provides a clocked signal to signal treating section 170. Signal treating section 170 includes a signal treating unit 172 that receives the clocked signal from master clock unit 112. Signal treating unit 172 employs the clocked signal to provide a ramping signal at a ramping frequency $f_0$ to ramp generating section 118. Ramp generating section 118 includes a phase ($\Phi$) detector/filter unit 150 and a slave VCO (voltage controlled oscillator)/ramp generator unit 152. $\Phi$ detector/filter unit 150 receives the ramping signal from signal treating unit 172 at a $\Phi$ detector unit input locus 154. $\Phi$ detector/filter unit 150 presents a phase indicator signal at a $\Phi$ detector unit output locus 156. Slave VCO/ramp generator unit 152 receives the phase indicator signal from $\Phi$ detector/filter unit 150 at a slave VCO input locus 158.

Slave VCO/ramp generator unit 152 provides a feedback signal via a feedback line 160 to $\Phi$ detector/filter unit 150. The feedback signal has a frequency substantially the same as the ramping signal ($f_0$). Slave VCO/ramp generator unit 52 also provides a sawtooth ramp signal via a line 164 to second comparator unit input locus 147. The sawtooth ramp signal has a frequency substantially the same as the ramping signal ($f_0$).

Signal treating unit 172 also employs the clocked signal received from master clock unit 112 to provide a chopping signal at a chopping frequency $f_c$ to chop input locus 134 of preamplifier 130. Chopping frequency $f_c$ is neither a fundamental frequency nor a harmonic frequency of ramping frequency $f_0$. Neither of chopping frequency $f_c$ and ramping frequency $f_0$ is an integer-multiple of the other of chopping frequency $f_c$ and ramping frequency $f_0$.

Figure 3:
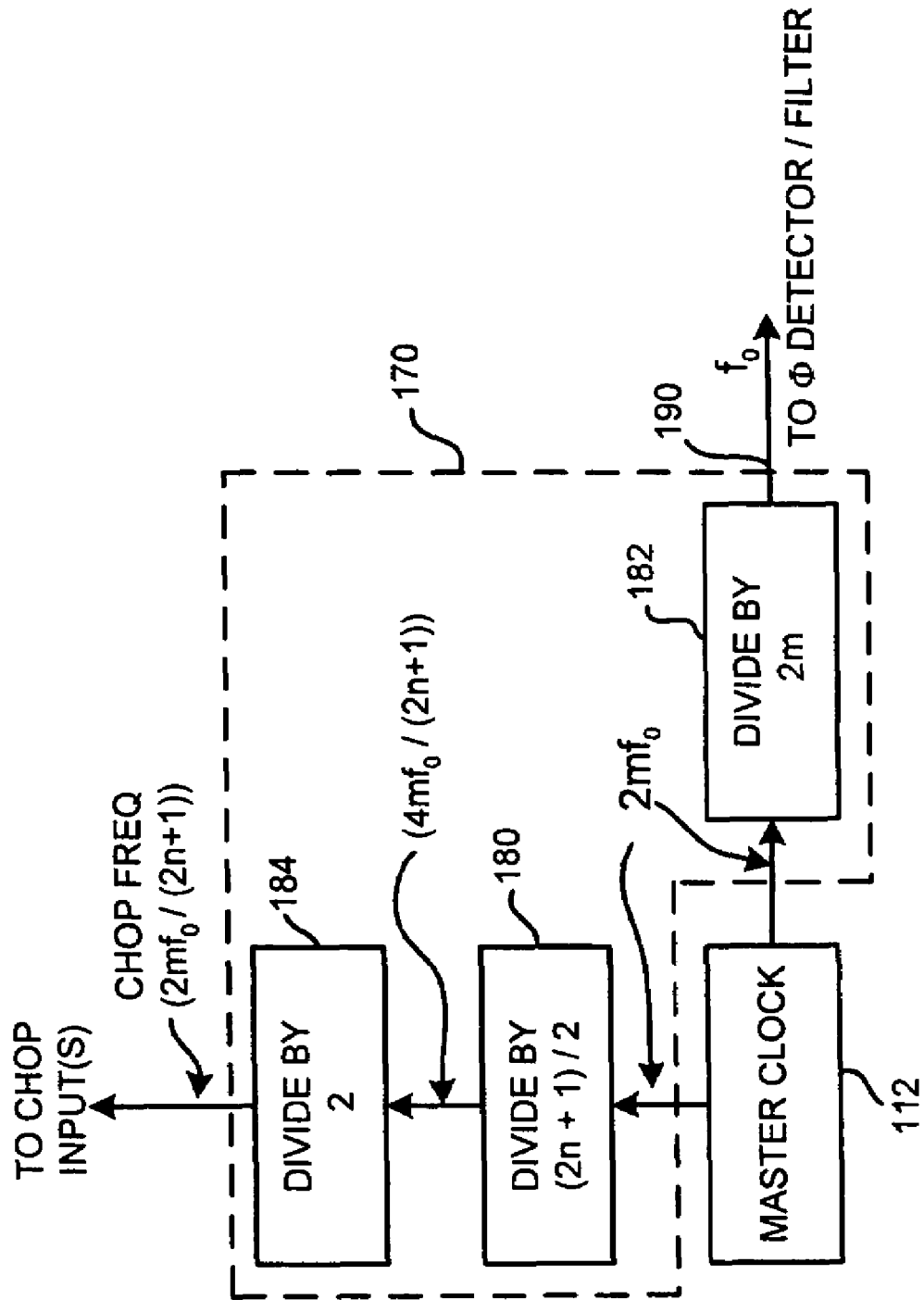
FIG. 3 is a schematic diagram illustrating a preferred embodiment of the signal treating apparatus of the present invention.

FIG. 3 is a schematic diagram illustrating a preferred embodiment of the signal treating apparatus of the present invention. In FIG. 3, a master clock unit 112 provides a clocked signal having a frequency $2mf_0$ to a first divider unit 180 and to a second divider unit 182 in a signal treating section 170. First divider unit 180 treats the clocked signal having a frequency $2mf_0$ to divide by $$\frac{(2n+1)}{2}$$

to present a treated signal having a frequency $$\frac{4mf_0}{(2n+1)}$$

to a third divider unit 184. Factors m and n are integers and are related according to the expression:

$$m \neq a(2n+1) \quad [1]$$

where a is an integer.

Third divider unit 184 further treats the treated signal having a frequency $$\frac{4mf_0}{(2n+1)}$$

to present a chopping signal having a frequency $$\frac{2mf_0}{(2n+1)}$$

for provision to a chop input, such as chop input 134 (FIG. 2). Third divider unit 184 may also provide the chopping signal having a frequency $$\frac{2mf_0}{(2n+1)}$$

to a chop input 135 for integrator 140 via a line 175 (FIG. 2).

Second divider unit 182 treats the clocked signal having a frequency $2mf_0$ to divide by 2m to present a ramping signal having a frequency $f_0$ at an output locus 190. Output locus 190 may be coupled, by way of example and not by way of limitation, to a $\Phi$ detector/filter unit 150 (FIG. 2).

By treating the clocked signal having a frequency $2mf_0$ as described above, it is ensured that neither of the chopping signal frequency $$\frac{2mf_0}{(2n+1)}$$

and ramping signal frequency $f_0$ is an integer-multiple of the other of chopping signal frequency $$\frac{2mf_0}{(2n+1)}$$

and ramping signal frequency $f_0$. That is, chopping signal frequency $$\frac{2mf_0}{(2n+1)}$$

is neither a fundamental frequency nor a harmonic frequency of ramping signal frequency $f_0$, and ramping signal frequency $f_0$ is neither a fundamental frequency nor a harmonic frequency of chopping signal frequency $$\frac{2mf_0}{(2n+1)}.$$

FIG. 4 is a flow chart illustrating the method of the present invention. In FIG. 4, a method 200 for effecting signal chopping in an amplifier device begins at a START locus 202. The amplifier device includes an amplifier section, a modulation section, a ramp generating section and a clock section. Method 200 continues by providing at least one signal treating unit coupled among the clock section, the amplifier section and the ramp generating section, as indicated by a block 204. Method 200 continues by operating the signal treating unit to cooperate with the clock section to effect providing a chopping signal to the amplifying unit at a chopping frequency and to effect providing a ramping signal at a ramping frequency to the ramp generating section, as indicated by a block 206. The chopping frequency is neither a fundamental frequency nor a harmonic frequency of the ramping frequency. Method 200 terminates at an END locus 208.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

I claim:

1. An apparatus for effecting signal chopping in an amplifier device; said amplifier device including an amplifier section, a modulation section, a ramp generating section and a clock section; the apparatus comprising: at least one signal treating unit coupled among said clock section, said amplifier section and said ramp generating section; said at least one signal treating unit cooperating with said clock section to effect providing a chopping signal to said amplifying unit at a chopping frequency and to effect providing a ramping signal at a ramping frequency to said ramp generating section; neither of said chopping frequency and said ramping frequency being an integer-multiple of the other of said chopping frequency and said ramping frequency.

2. An apparatus for effecting signal chopping in an amplifier device as recited in claim 1 wherein said clock section presents a clock signal having a clock frequency, and wherein said ramping frequency is substantially equal with said clock frequency.

3. An apparatus for effecting signal chopping in an amplifier device as recited in claim 1 wherein said signal treating unit is further coupled with said modulation section; said signal treating unit providing said chopping signal to at least one of said amplifier section and said modulation section.

4. An apparatus for effecting signal chopping in an amplifier device as recited in claim 2 wherein said signal treating unit is further coupled with said modulation section; said signal treating unit providing said chopping signal to at least one of said amplifier section and said modulation section.

5. An apparatus for effecting signal chopping in an amplifier device; said amplifier device including an amplifier section, a modulation section, a ramp generating section and a clock section; the apparatus comprising: at least one signal treating unit coupled among said clock section, said amplifier section and said ramp generating section; said at least one signal treating unit cooperating with said clock section to effect providing a chopping signal to said amplifying unit at a chopping frequency and to effect providing a ramping signal at a ramping frequency to said ramp generating section; said chopping frequency being neither a fundamental frequency nor a harmonic frequency of said ramping frequency.

6. An apparatus for effecting signal chopping in an amplifier device as recited in claim 5 wherein said clock section presents a clock signal having a clock frequency, and wherein said ramping frequency is substantially equal with said clock frequency.

7. An apparatus for effecting signal chopping in an amplifier device as recited in claim 5 wherein said signal treating unit is further coupled with said modulation section; said signal treating unit providing said chopping signal to at least one of said amplifier section and said modulation section.

8. An apparatus for effecting signal chopping in an amplifier device as recited in claim 6 wherein said signal treating unit is further coupled with said modulation section; said signal treating unit providing said chopping signal to at least one of said amplifier section and said modulation section.

9. A method for effecting signal chopping in an amplifier device; said amplifier device including an amplifier section, a modulation section, a ramp generating section and a clock section; the method comprising the steps of:

(a) providing at least one signal treating unit coupled among said clock section, said amplifier section and said ramp generating section;

(b) operating said signal treating unit to cooperate with said clock section to effect providing a chopping signal to said amplifying unit at a chopping frequency and to effect providing a ramping signal at a ramping frequency to said ramp generating section; said chopping frequency being neither a fundamental frequency nor a harmonic frequency of said ramping frequency.

10. A method for effecting signal chopping in an amplifier device as recited in claim 9 wherein said clock section presents a clock signal having a clock frequency, and wherein said ramping frequency is substantially equal with said clock frequency.

11. A method for effecting signal chopping in an amplifier device as recited in claim 9 wherein said signal treating unit is further coupled with said modulation section; said signal treating unit providing said chopping signal to at least one of said amplifier section and said modulation section.

12. A method for effecting signal chopping in an amplifier device as recited in claim 10 wherein said signal treating unit is further coupled with said modulation section; said signal treating unit providing said chopping signal to at least one of said amplifier section and said modulation section.

* * * * *